(12) United States Patent
Villemoes et al.

(10) Patent No.: US 7,519,538 B2
(45) Date of Patent: Apr. 14, 2009

(54) AUDIO SIGNAL ENCODING OR DECODING

(75) Inventors: Lars Falck Villemoes, Järfälla (SE); Per Ekstrand, Stockholm (SE); Heiko Purnhagen, Sundbyberg (SE); Erik Gosuinus Petrus Schuijers, Eindhoven (NL); Fransiscus Marinus Jozephus de Bont, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 323 days.

(21) Appl. No.: 10/577,106

(22) PCT Filed: Oct. 28, 2004

(86) PCT No.: PCT/IB2004/052226

§ 371 (c)(1),
(2), (4) Date: Apr. 25, 2006

(87) PCT Pub. No.: WO2005/043511

PCT Pub. Date: May 12, 2005

(65) Prior Publication Data

US 2007/0067162 A1 Mar. 22, 2007

(30) Foreign Application Priority Data

Oct. 30, 2003 (EP) .................................. 03104034

(51) Int. Cl.
*G10L 19/00* (2006.01)
*G10L 19/14* (2006.01)

(52) U.S. Cl. ..................... 704/501; 704/205; 704/211

(58) Field of Classification Search ............... None
See application file for complete search history.

(56) References Cited

U.S. PATENT DOCUMENTS 5,890,125 A * 3/1999 Davis et al. .............. 704/501

(Continued)

FOREIGN PATENT DOCUMENTS

EP        446037 A2 *  9/1991

OTHER PUBLICATIONS

M. Dietz et al. "Spectral Band Replication, a novel approach in audio coding", Preprint 5553, 112th AES Convention, Munich, Germany, May 10-13, 2002.

(Continued)

*Primary Examiner*—David R Hudspeth
*Assistant Examiner*—Brian L Albertalli (57) ABSTRACT

Encoding an audio signal is provided wherein the audio signal includes a first audio channel and a second audio channel, the encoding comprising subband filtering each of the first audio channel and the second audio channel in a complex modulated filterbank to provide a first plurality of subband signals for the first audio channel and a second plurality of subband signals for the second audio channel, downsampling each of the subband signals to provide a first plurality of downsampled subband signals and a second plurality of downsampled subband signals, further subband filtering at least one of the downsampled subband signals in a further filterbank in order to provide a plurality of sub-subband signals, deriving spatial parameters from the sub-subband signals and from those downsampled subband signals that are not further subband filtered, and deriving a single channel audio signal comprising derived subband signals derived from the first plurality of downsampled subband signals and the second plurality of downsampled subband signals. Further, decoding is provided wherein an encoded audio signal comprising an encoded single channel audio signal and a set of spatial parameters is decoded by decoding the encoded single channel audio channel to obtain a plurality of downsampled subband signals, further subband filtering at least one of the downsampled subband signals in a further filterbank in order to provide a plurality of sub-subband signals, and deriving two audio channels from the spatial parameters, the sub-subband signals and those downsampled subband signals that are not further subband filtered.

28 Claims, 10 Drawing Sheets

U.S. PATENT DOCUMENTS

| | | | | |
|---|---|---|---|---|
| 5,926,791 | A | * | 7/1999 | Ogata et al. .................. 704/500 |
| 6,016,473 | A | * | 1/2000 | Dolby ........................ 704/500 |
| 6,680,972 | B1 | * | 1/2004 | Liljeryd et al. .............. 375/240 |
| 7,181,019 | B2 | * | 2/2007 | Breebaart et al. ............. 381/23 |

OTHER PUBLICATIONS

P. Ekstrand "Bandwidth Extension of Audio Signals by Spectral Band Replication", Proc. 1st IEEE Benelux Workshop on Model based Processing and Coding of Audio (MPCA-2002), pp. 53-58, Leuven, Belgium, Nov. 15, 2002, XP000962047.

E.G.P. Schuijers et al. "Advances in Parametric Coding for High-Quality Audio", IEEE Benelux Workshop on Model based Processing and Coding of Audio (MPCA-2002), pp. 73-79, Nov. 15, 2002, XP001156065.

Oliver Kunz "3rd Generation Partnershop Project; Technical Specification Group Services and System Aspects; General Audio Codec audio processing functions; Enhanced aacPlus general audio codec; Encoder Specification Parametric Stereo part (Release 6)" 3GPP TS 26.405 V1.0.0, May 17, 2004, pp. 1-18, XP002306995.

Wen Jin et al. "A Scalable Subband Audio Coding Scheme for ATM Environments", Proceedings IEEE Southeastcon 2001, Engineering The Future, Clemson, SC Mar. 30-Apr. 1, 2001, IEEE Southeastcon, New York, NY; IEEE, US, Mar. 30, 2001, pp. 271-275, XP010542621.

* cited by examiner

AUDIO SIGNAL ENCODING OR DECODING

The invention relates to encoding an audio signal or decoding an encoded audio signal.

Figure 1:
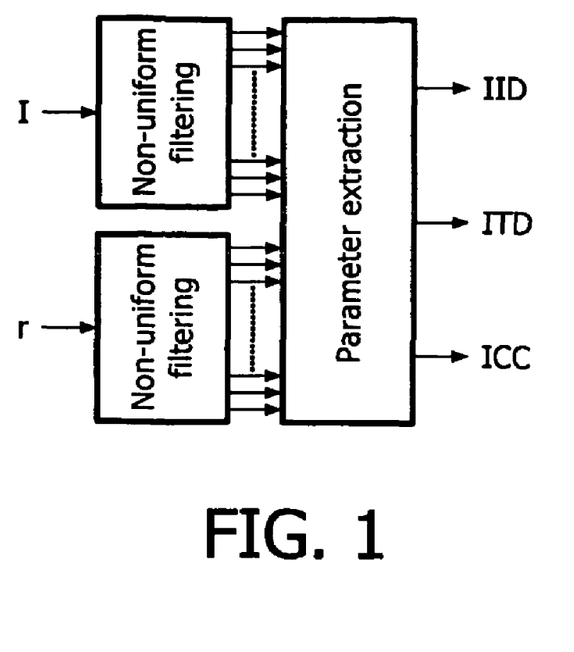
FIG. 1 shows a block diagram of a unit for stereo parameter extraction as used in a Parametric Stereo ("PS") encoder.
Figure 2:
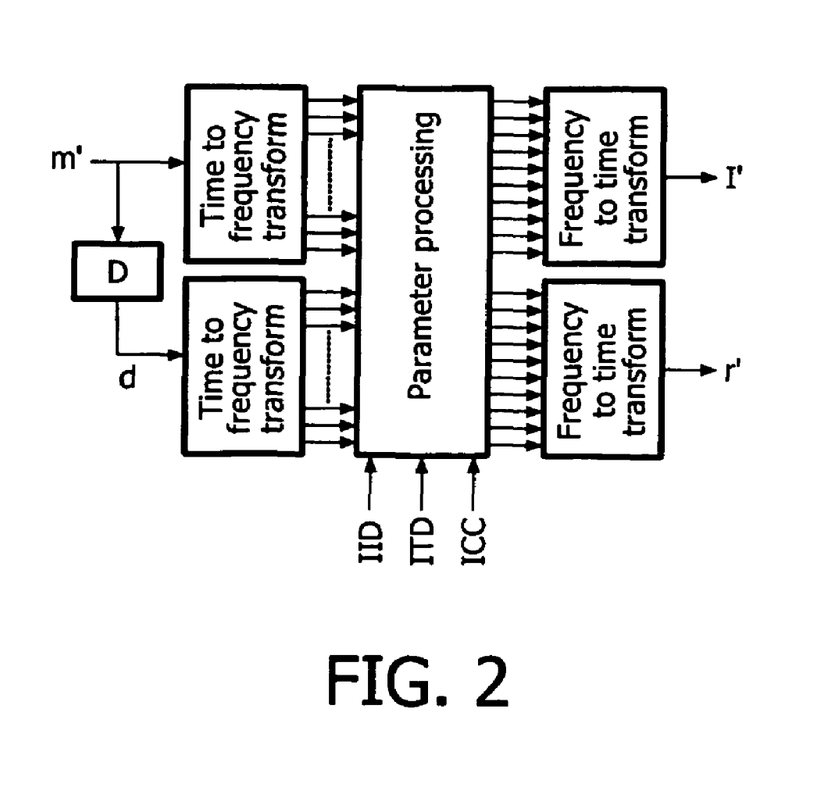
FIG. 2 shows a block diagram of a unit for the reconstruction of a stereo signal as used in a PS decoder.

Erik Schuijers, Weaner Oomen, Bert den Brinker and Jeroen Breebaart, "Advances in Parametric Coding for High-Quality Audio", Preprint 5852, 114th AES Convention, Amsterdam, The Netherlands, 22-25 Mar. 2003 disclose a parametric coding scheme using an efficient parametric representation for the stereo image. Two input signals are merged into one mono audio signal. Perceptually relevant spatial cues are explicitly modeled as is shown in FIG. 1. The merged signal is encoded using a mono parametric encoder. The stereo parameters Interchannel Intensity Difference (IHD), the Interchannel Time Difference (ITD) and the Interchannel Cross-Correlation (ICC) are quantized encoded and multiplexed into a bitstream together with the quantized and encoded mono audio signal. At the decoder side, the bitstream is de-multiplexed to an encoded mono signal and the stereo parameters. The encoded mono audio signal is decoded in order to obtain a decoded mono audio signal m' (see FIG. 2). From the mono time domain signal, a de-correlated signal is calculated using a filter D yielding perceptual de-correlation. Both the mono time domain signal m' and the de-correlated signal d are transformed to the frequency domain. Then the frequency domain stereo signal is processed with the IID, ITD and ICC parameters by scaling, phase modifications and mixing, respectively, in a parameter processing unit in order to obtain the decoded stereo pair l' and r'. The resulting frequency domain representations are transformed back into the time domain.

An object of the invention is to provide advantageous audio encoding or decoding using spatial parameters. To this end, the invention provides an encoding method, an audio encoder, an apparatus for transmitting or storing, a decoding method, an audio decoder, a reproduction apparatus and a computer program product as defined in the independent claims. Advantageous embodiments are defined in the dependent claims.

According to a first aspect of the invention, an audio signal is encoded, the audio signal including a first audio channel and a second audio channel, the encoding comprising subband filtering each of the first audio channel and the second audio channel in a complex modulated filterbank to provide a first plurality of subband signals for the first audio channel and a second plurality of subband signals for the second audio channel, downsampling each of the subband signals to provide a first plurality of downsampled subband signals and a second plurality of downsampled subband signals, further subband filtering at least one of the downsampled subband signals in a further filterbank in order to provide a plurality of sub-subband signals, deriving spatial parameters from the sub-subband signals and from those downsampled subband signals that are not further subband filtered, and deriving a single channel audio signal comprising derived subband signals derived from the first plurality of downsampled subband signals and the second plurality of downsampled subband signals. By providing a further subband filtering in a subband, the frequency resolution of said subband is increased. Such an increased frequency resolution has the advantage that it becomes possible to achieve higher audio quality (the bandwidth of a single sub-band signal is typically much higher than that of critical bands in the human auditory system) in an efficient implementation (because only a few bands have to be transformed). The parametric spatial coder tries to model the binaural cues, which are perceived on a non-uniform frequency scale, resembling the Equivalent Rectangular Bands (ERB) scale. The single channel audio signal can be derived directly from the first plurality of downsampled subband signals and the second plurality of downsampled subband signals. However, the single channel audio signal is advantageously derived from sub-subband signals for those downsampled subbands that are further subband filtered, in which case the sub-subband signals of each subband are added together to form new subband signals and wherein the single channel audio signal is derived from these new subband signals and the subbands from the first and second plurality of subbands that are not further filtered.

According to another main aspect of the invention, audio decoding of an encoded audio signal is provided, the encoded audio signal comprising an encoded single channel audio signal and a set of spatial parameters, the audio decoding comprising decoding the encoded single channel audio channel to obtain a plurality of downsampled subband signals, further subband filtering at least one of the downsampled subband signals in a further filterbank in order to provide a plurality of sub-subband signals, and deriving two audio channels from the spatial parameters, the sub-subband signals and the downsampled subband signals for those subbands that are not further subband filtered. By providing a further subband filtering in a subband, the frequency resolution of said subband is increased and consequently higher quality audio decoding can be reached.

One of the main advantages of these aspects of the invention is that parametric spatial coding can be easily combined with Spectral Band Replication ("SBR") techniques. SBR is known per se from Martin Dietz, Lars Liljeryd, Kristofer Kjörling and Oliver Kunz, "Spectral Band Replication, a novel approach in audio coding", Preprint 5553, $112^{th}$ AES Convention, Munich, Germany, 10-13 May 2002, and from Per Ekstrand, "Bandwidth extension of audio signals by spectral band replication", Proc. 1st IEEE Benelux Workshop on Model based Processing and Coding of Audio (MPCA-2002), pp. 53-58, Leuven, Belgium, Nov. 15, 2002. Further reference is made to the MPEG-4 standard ISO/IEC 144963: 2001/FDAM1, JTC1/SC29/WG11, Coding of Moving Pictures and Audio, Bandwidth Extension which describes an audio codec using SBR.

Figure 3:
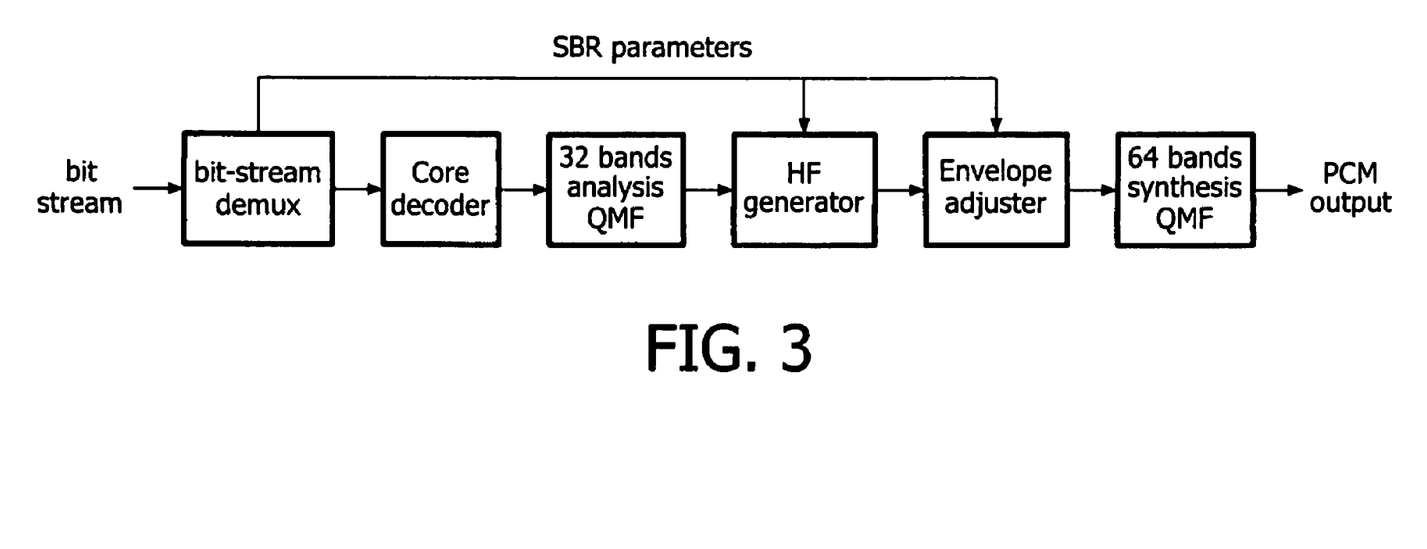
FIG. 3 shows a block diagram of a Spectral Band Replication ("SBR") decoder.

SBR is based on the notion that there is typically a large correlation between the low and the high frequencies in an audio signal. As such, the SBR process consists of copying the lower part(s) of the spectrum to the higher part(s) after which the spectral envelope is adjusted for the higher part(s) of the spectrum using little information encoded in the bit stream. A simplified block diagram of such an SBR enhanced decoder is shown in FIG. 3. The bit-steam is de-multiplexed and decoded into core data (e.g. MPEG-2/4 Advanced Audio Coding (AAC)) and SBR data Using the core data the signal is decoded at half the sampling frequency of the full bandwidth signal. The output of the core decoder is analyzed by means of a 32 bands complex (Pseudo) Quadrature Mirror Filter (QMF) bank. These 32 bands are then extended to full bandwidth, i.e., 64 bands, in which the High Frequency (HF) content is generated by means of copying part(s) of the lower bands. The envelope of the bands for which the HF content is generated is adjusted according to the SBR data Finally by means of a 64 bands complex QMF synthesis bank the PCM output signal is reconstructed.

The SBR decoder as shown in FIG. 3 is a so-called dual rate decoder. This means that the core decoder runs at half the sampling frequency and therefore only a 32 bands analysis QMF bank is used. Single rate decoders, where the core decoder runs at the fill sampling frequency and the analysis QMF bank consists of 64 bands are also possible. In practice, the reconstruction is done by means of a (pseudo) complex QMF bank. Because the complex QMF filter bank is not critically sampled no extra provisions need to be taken in order to account for aliasing. Note that in the SBR decoder as disclosed by Ekstrand, the analysis QMF bank consists of only 32 bands, while the synthesis QMF bank consists of 64 bands, as the core decoder runs at half the sampling frequency compared to the entire audio decoder. In the corresponding encoder however, a 64 bands analysis QMF bank is used to cover the whole frequency range.

Although the invention is especially advantageous for stereo audio coding, the invention is also of advantage to coding signals with more than two audio channels.

These and other aspects of the invention are apparent from and will be elucidated with reference to the embodiments described hereinafter.

Figure 4:
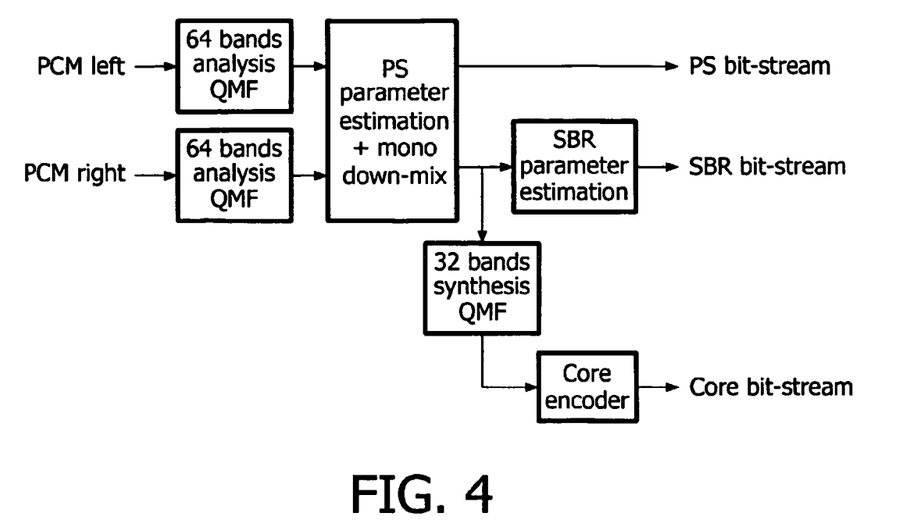
FIG. 4 shows a block diagram of combined PS and SBR enhanced encoder according to an embodiment of the invention.

Combining SBR with PS potentially yields an extremely powerful codec. Both SBR and PS are post-processing algorithms in a decoder consisting of a fairly similar structure, i.e., some form of time to frequency conversion, processing and finally frequency to time conversion. When combining both algorithms, it is required that both algorithms can run concurrently on e.g. a DSP application. Hence, it is advantageous to reuse as much as possible of the calculated intermediate results of one codec for the other. In the case of combining PS with SBR this leads to reusing the complex (Pseudo) QMF sub-band signals for PS processing. In a combined encoder (see FIG. 4) the stereo input signal is analyzed by means of two 64 bands analysis filter banks. Using the complex sub-band domain representation, a PS calculation unit estimates the stereo parameters and creates a mono (sub-band) down-mix is created. This mono down-mix is then fed to an SBR parameter estimation unit Finally the mono down-mix is converted back to the time domain by means of a 32 bands synthesis filter bank such that it can be coded by the core decoder (core decoder needs only half the bandwidth).

Figure 5:
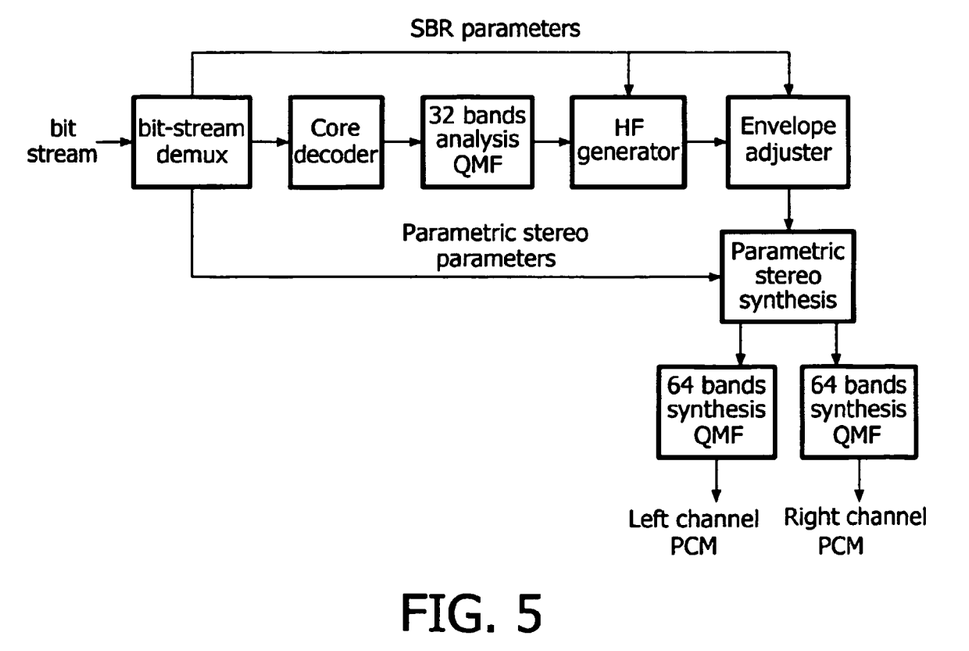
FIG. 5 shows a block diagram of combined PS and SBR enhanced decoder according to an embodiment of the invention.

In the combined decoder as shown in FIG. 5, regardless whether or not a dual rate or a single rate system is being used, the full bandwidth (64 bands) subband domain signals after envelope adjustment are converted to a stereo set of subband domain signals according to the stereo parameters. These two sets of sub-band signals are finally converted to the time domain by means of the 64 bands synthesis QMF bank. If one would just combine PS with SBR, the bandwidth of the lower frequency bands of the QMF filter is larger than what is required for a high quality stereo representation. So, in order to be able to give a high quality representation of the stereo image, a further sub-division of the lower sub-band signals is performed according to advantageous embodiments of the invention.

For a better understanding of aspects of the invention, the theory behind complex QMF sub-band filters is first explained.

QMF Sub-band Filters

Figure 6:
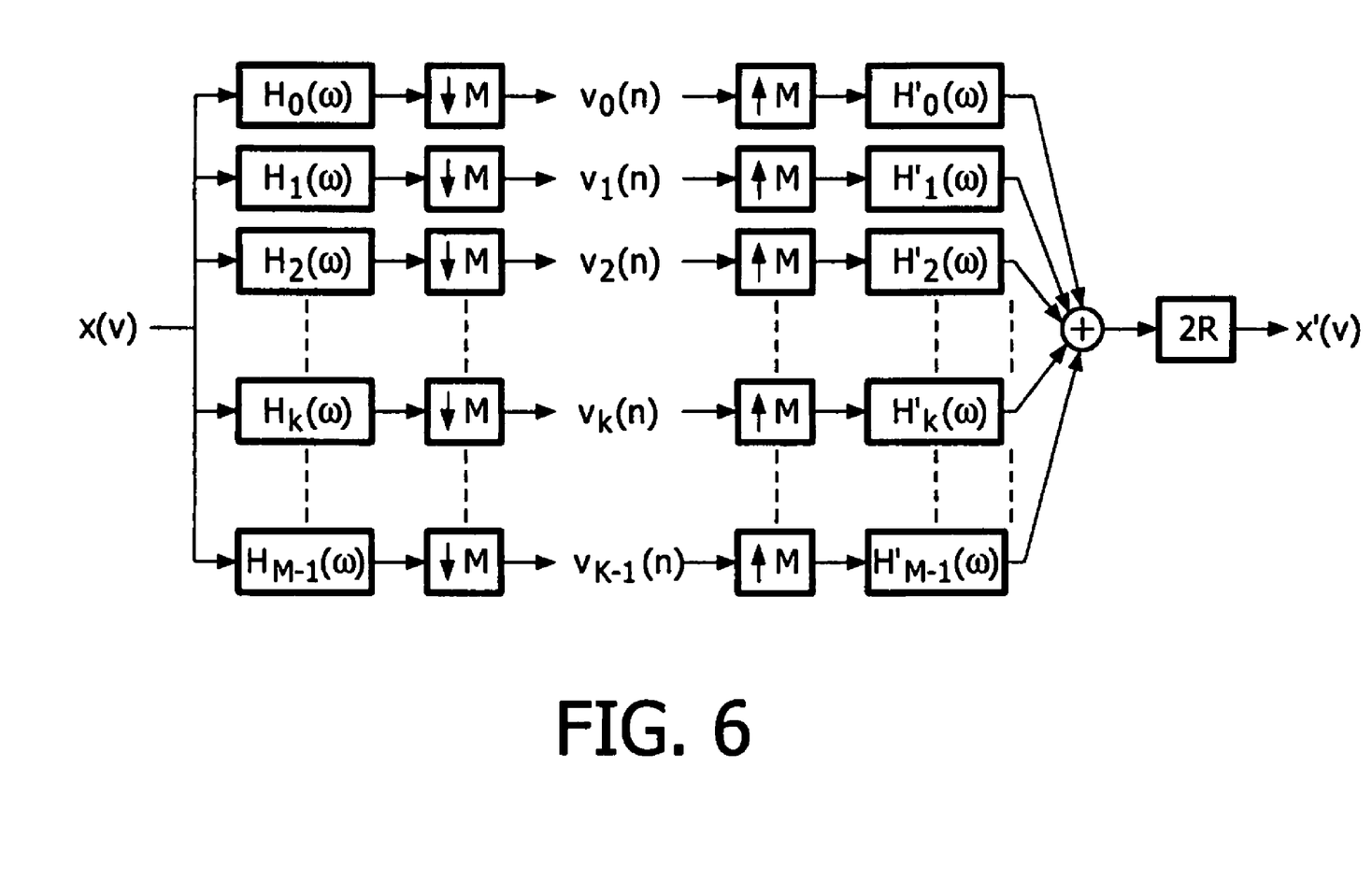
FIG. 6 shows an M bands downsampled complex QMF analysis (left) and synthesis bank (right)

The QMF analysis sub-band filter can be described as following. Given a real valued linear phase prototype filter p(v), an M-band complex modulated analysis filter bank can be defined by the analysis filters $$h_k(v) = p(v)\exp\left\{i\frac{\pi}{M}(k + 1/2)(v - \theta)\right\}, \quad (1)$$

for k=0,1, . . . ,M−1. The phase parameter θ is not important for the analysis that follows, but a typical choice is (N+M)/2, where N is the prototype filter order. Given a real valued discrete time signal x(v), the sub-band signals $v_k(n)$ are obtained by filtering (convolution) x(v) with $h_k(v)$, and then downsampling the result by a factor M (see left hand side of FIG. 6).

Figure 7:
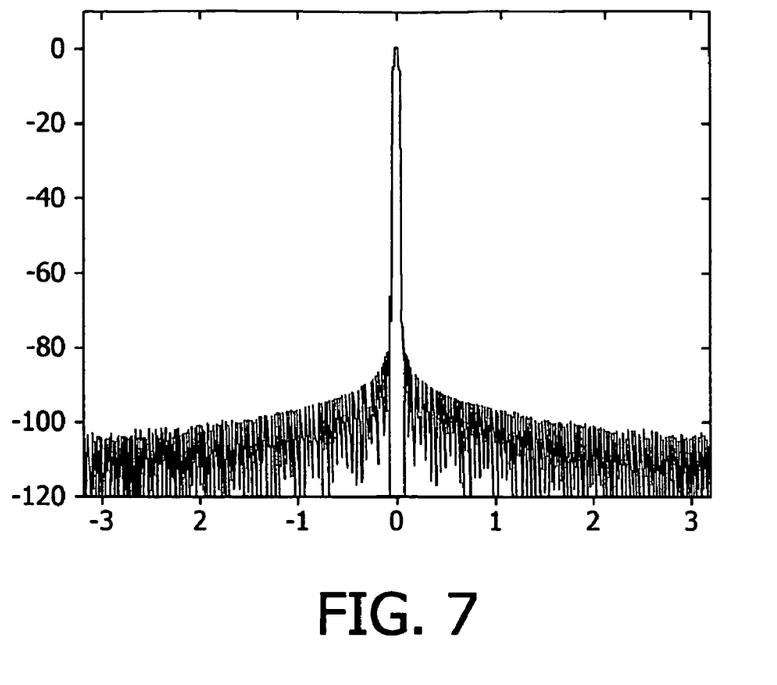
FIG. 7 shows a magnitude response in dB of a prototype filter.

A synthesis operation consists of first upsampling the QMF sub-band signals with a factor M, followed by filtering with complex modulated filters of the type (1), adding up the results and finally taking twice the real part (see right hand side of FIG. 6). Then near-perfect reconstruction of real valued signals can be obtained by suitable design of a real valued linear phase prototype filter p(v). The magnitude response of the prototype filter as used in the SBR system of the MPEG-4 standard (referred to above) in case of 64 bands is shown in FIG. 7. The magnitude responses of the 64 complex modulated analysis filters are obtained by shifting the magnitude response of the prototype filter p(v) by $$\frac{\pi}{M}\left(k + \frac{1}{2}\right).$$

Figure 8:
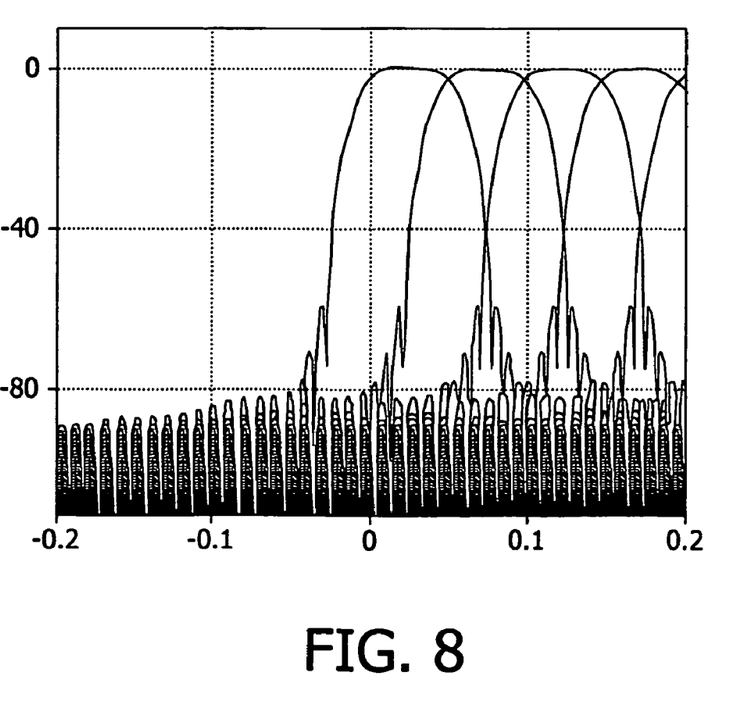
FIG. 8 shows a magnitude responses in dB of the first four out of 64 non-downsampled complex modulated analysis filters.

Part of these responses is shown in FIG. 8. Note that only the positive frequencies are filtered, except for k=0 and k=M−1. As a result the sub-band signals prior to downsampling are close to being analytic, facilitating easy amplitude and phase modifications of real-valued sinusoids. Phase modifications are also possible for the first and last band as long as the sinusoids residing in these bands have a frequency that is above π/2M or below or π−π/2M respectively. For frequencies outside this region the performance of phase modification deteriorates rapidly because of interference of the negative frequencies.

Starting from the QMF analysis filters as described above, in embodiments of the invention, a finer frequency resolution is obtained by further filtering each downsampled subband signal $v_k(n)$ into $Q_k$ sub-subbands. In the following the properties of the further subband filtering will be derived.

Signal Modification in the Complex QMF Sub-band Domain

In the following, let $Z(\omega) = \sum_{n=-\infty}^{\infty} z(n) \exp(-in\omega)$ be the discrete time Fourier transform of a discrete time signal $z(n)$. Assuming the near-perfect reconstruction property as mentioned above and also a design where $P(\omega)$, the Fourier transform of $p(v)$, essentially vanishes outside the frequency interval $[-\pi/M, \pi/M]$, which is the case for the prototype filter $p(v)$ as illustrated above, the next step here is to consider a system where the sub-band signals $v_k(n)$ are modified prior to synthesis. Now, let each sub band k be modified by filtering with a filter $B_k(\omega)$. With the extending definition $$B_k(\omega) = B_{-1-k}(-\omega)^* \text{ for } k<0, \tag{2}$$

where the star denotes complex conjugation, it can then be shown (neglecting overall delay, assuming a real valued input and a single rate system) that the resulting system including filter bank synthesis corresponds to a filtering with the filter $$B(\omega) = \sum_{k=-M}^{M-1} B_k(M\omega) |P(\omega - \pi(k+1/2)/M)|^2. \tag{3}$$

According to the hypotheses regarding the properties of $P(\omega)$, inserting $B_k(\omega)=1$ for all k in (3) leads to $B(\omega)=1$, and a squared sum identity follows for the shifted prototype filter responses. By choosing real-valued constants $B_k(\omega)=b_k \geq 0$ the system acts as an equalizer, which interpolates the gain values $b_k$ at frequencies $\pi(k+\frac{1}{2})/M$. The attractive feature is that the overall system is time-invariant, that is, free of aliasing, in spite of the use of down- and upsampling. This will of course only be true up to the amount of deviation to the stated prototype filter hypotheses.

In order to derive a mono audio signal, additional sub-filtering of the complex sub-band signals should not only preserve these properties, but also extend these properties to manipulation of the filtered sub-band signals. Sub-filtering preserving these properties can be performed using a modification of so-called Mth band filters as known per se from P. P. Vaidyanathan, "Multirate systems and filter banks", Prentice Hall Signal Processing Series, 1993, sections 4.6.1-4.6.2).

Modulated Filter Banks with Trivial Synthesis

Figure 9:
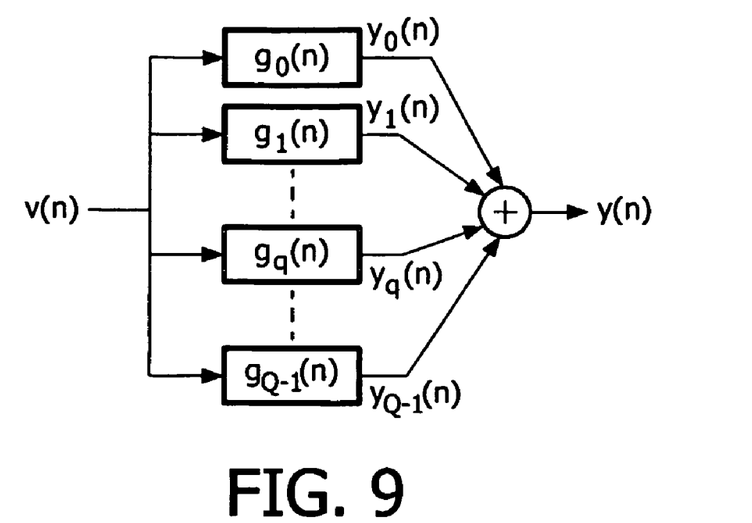
FIG. 9 shows a block diagram of a Q bands filter bank with trivial synthesis.

A discrete time signal $v(n)$ can be split into Q different signals by a bank of filters with impulse responses $g_q(n)$, $q=0,1,\ldots,Q-1$. This is illustrated in FIG. 9. Let the corresponding analysis outputs be $y_q(n)$, and consider the trivial synthesis operation $$y(n) = \sum_{q=0}^{Q-1} y_q(n). \tag{4}$$

Perfect reconstruction, $y(n) = v(n)$, is then obtained by choosing the filters such that $$\sum_{q=0}^{Q-1} g_q(n) = \delta(n), \tag{5}$$

where $\delta(n)=1$ if $n=0$, and $\delta(n)=0$ if $n \neq 0$. For causal filters, the right hand side of (5) would have to be replaced with $\delta(n-d)$ where d is a positive delay, but this straightforward modification is omitted for clarity of exposition.

The filters $g_q(n)$ can be chosen as complex modulations of a prototype filter $g(n)$ through $$g_q(n) = g(n) \exp\left\{i \frac{2\pi}{Q}(q+1/2)n\right\}. \tag{6}$$

In this preferred embodiment of the invention, the filters are oddly stacked (the factor $q+\frac{1}{2}$). An advantage of this preferred embodiment will be explained later. Perfect reconstruction (5) is obtained if and only if $$g(Qn) = \delta(n)/Q. \tag{7}$$

A variation of this is the real-valued cosine modulation as $$g_q(n) = g(n) \cos\left\{\frac{\pi}{Q}(q+1/2)n\right\}, \tag{8}$$

with a real-valued prototype filter $g(m)$ satisfying $$g(2Qn) = \delta(n)/Q. \tag{9}$$

(This is easily obtained by consideration of $g_q(n) + g_{Q-1-q}(n)$ in (6).)

Sub-filtering the Complex-exponential Modulated Filter Bank

Starting from the QMF analysis filters as described above, a finer frequency resolution is obtained by further filtering each downsampled subband signal $v_k(n)$ into $Q_k$ sub-sub-bands by using one of the modulated structures (6) or (8) above. Denote the resulting output signals $y_q^k(n)$, and let $g_q^k(n)$ describe the filter bank applied within sub band k. If $Q_k=1$, there is no filtering and $g_0^k(n) = \delta(n)$. A typical application example is the case where $M=64$, $Q_0=8$, $Q_k=4$ for $k=1,2$, and $Q_k=1$ for $k>2$.

The combined effect of the two filter banks from $x(v)$ to $y_q^k(n)$ can be described as filtering with filters $F_q^k(\omega)$ followed by downsampling by a factor M, where $$F_q^k(\omega) = H_k(\omega) G_q^k(M\omega). \tag{10}$$

If the prototype filter response $P(\omega)$ is essentially zero outside the interval $[-\omega/M, \pi/M]$, which is the case for the SBR analysis filters (see FIG. 7), then the filter $F_q^k(\omega)$ has a single nominal center frequency defined in the complex modulated case by $$\omega_{k,q} = 2\pi \left(q + Q_k s + \frac{1}{2}\right) / (MQ_k), \tag{11}$$

where s is a integer chosen such that $$Q_k\left(k - \frac{1}{2}\right) \leq 2(q + Q_k s) + 1 \leq Q_k\left(k + \frac{3}{2}\right).$$

Figure 10:
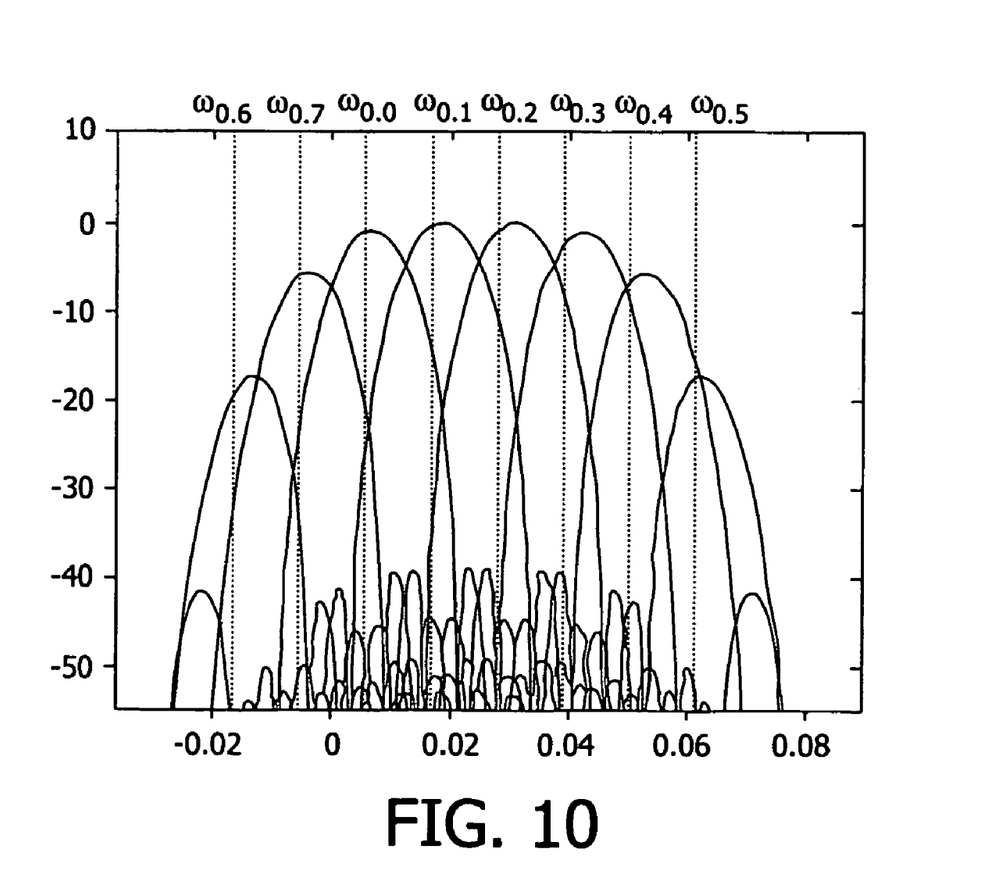
FIG. 10 shows a combined magnitude response in dB of a first non-downsampled modulated QMF filter and 8 bands complex modulated filter bank.

For example, as illustrated in FIG. 10, if k=0 and $Q_0$=8, the values of $\omega_{0,0}, \omega_{0,1}, \ldots, \omega_{0,7}$ are $$\frac{\pi}{8M}(1, 3, 5, 7, 9, 11, -3, -1).$$

Signal Modification with Non-uniform Frequency Resolution

The insertion of sub-subband filter banks as described above does not introduce further downsampling, so the alias-free performance of signal modification as shown above in the case of complex QMF only, is preserved. Consider the general combined operation of M-subband analysis, further subband filtering by using $Q_k$ sub-subbands within subband k, filtering of each sub-subband signal $y_q^k(n)$ by a filter $A_{k,q}(\omega)$, synthesis within each subband k by summation, and finally synthesis through the M-band synthesis bank. The overall transfer function of such a system is given by (3) with, for k≧0, $$B_k(\omega) = \sum_{q=0}^{Q_k-1} A_{k,q}(\omega) G_q^k(\omega), \quad (12)$$

For $\omega > \pi/(2M)$, this gives $$B(\omega) = \sum_{k=0}^{M-1} \sum_{q=0}^{Q_k-1} A_{k,q}(M\omega) G_q^k(M\omega) |P(\omega - \pi(k+1/2)/M)|^2, \quad (13)$$

so the throughput response of the sub-subband (k,q) is $G_q^k(M\omega)|P(\omega-\pi(k+\frac{1}{2})/M)|^2$. For $|\omega|\leq\pi/(2M)$, some care has to be taken due to (2). In this frequency range it holds that $$B(\omega)=B_0(M\omega)|P(\omega-\pi/(2M))|^2+B_0(-M\omega)^*|P(\omega+\pi/(2M))|^2 \quad (14)$$

and assuming a real sub-subband prototype filter coefficients, it holds that $$G_q^0(-\omega)^* = G_{Q_0-1-q}^0(\omega), \quad (15)$$

so if the modifying filters are chosen such that $$A_{0,q}(-\omega)^* = A_{0,Q_0-1-q}(\omega), \quad (16)$$

then $B_0(-M\omega)^* = B_0(M\omega)$ and the squared sum identity mentioned in connection with (3) leads to $$B(\omega) = B_0(M\omega) = \sum_{q=0}^{Q_k-1} A_{0,q}(M\omega) G_q^0(M\omega) \quad (17)$$

for $|w|\leq\pi/(2M)$, corresponding to a throughput response $G_q^0(M\omega)$ for sub-subband (0,q).

Figure 11:
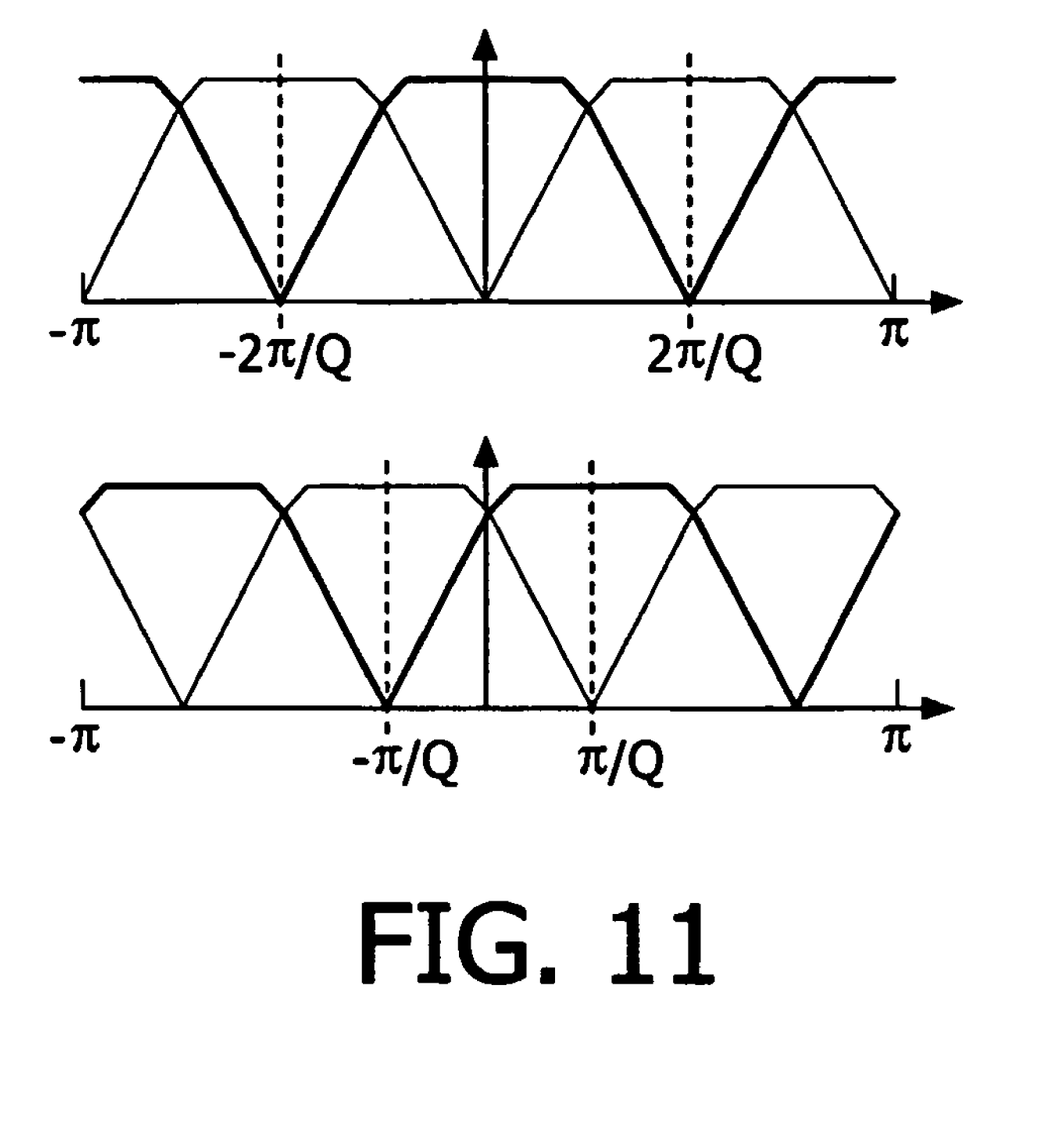
FIG. 11 shows a stylized magnitude response of 4 bands evenly stacked filter bank (top) and oddly stacked filter bank (bottom) according to an embodiment of the invention.

Equations (15) until (17) indicate the desire to discriminate between positive and negative frequencies. This is the reason why oddly stacked (complex) filters are being used for sub-filtering the QMF subband signals instead of evenly stacked (complex) filters (see FIG. 11). For evenly stacked filters it is not possible to apply phase modifications of sinusoids residing in the centre filter, i.e., the filter with a centre frequency of zero, as there is no discrimination between positive and negative frequencies possible. Assuming a prototype filter with a response G(ω) band limited to [−2π/Q,2π/Q], with Q the number of bands, for the evenly stacked case the lower limit to which phase modifications can approximately be applied is 2π/Q, whereas for the oddly stacked case the lower limit to which phase modifications approximately can be applied is π/Q.

As mentioned in the introduction, for PS synthesis important special cases of the above are equalization and phase modification. For equalization, $A_{k,q}(\omega)=a_{k,q}\geq 0$ and the condition (16) reduces to $$a_{0,q} = a_{0,Q_0-1-q}. \quad (18)$$

The phase modification case corresponds to $A_{k,q}(\omega)=\exp(i\alpha_{k,q})$ in which case the condition (16) is satisfied if $$\alpha_{0,Q_0-1-q} = -\alpha_{0,q}. \quad (19)$$

Stereo Parameter Estimation

The non-uniform complex filter bank, i.e. the QMF bank followed by the further subband filtering, as described above, can be applied to estimate the stereo parameters Inter-channel Intensity Differences (IID), Inter-channel Phase Differences (IPD) and Inter-channel Cross Correlation (ICC) as shown below. Note that in this practical embodiment, IPD is used as a practically equivalent substitute for the ITD as used in the paper of Schuijers et al. In the combined PS encoder (see FIG. 4) the first three complex QMF channels are sub-filtered so that in total 77 complex-valued signals are obtained (see FIG. 12).

Figure 12:
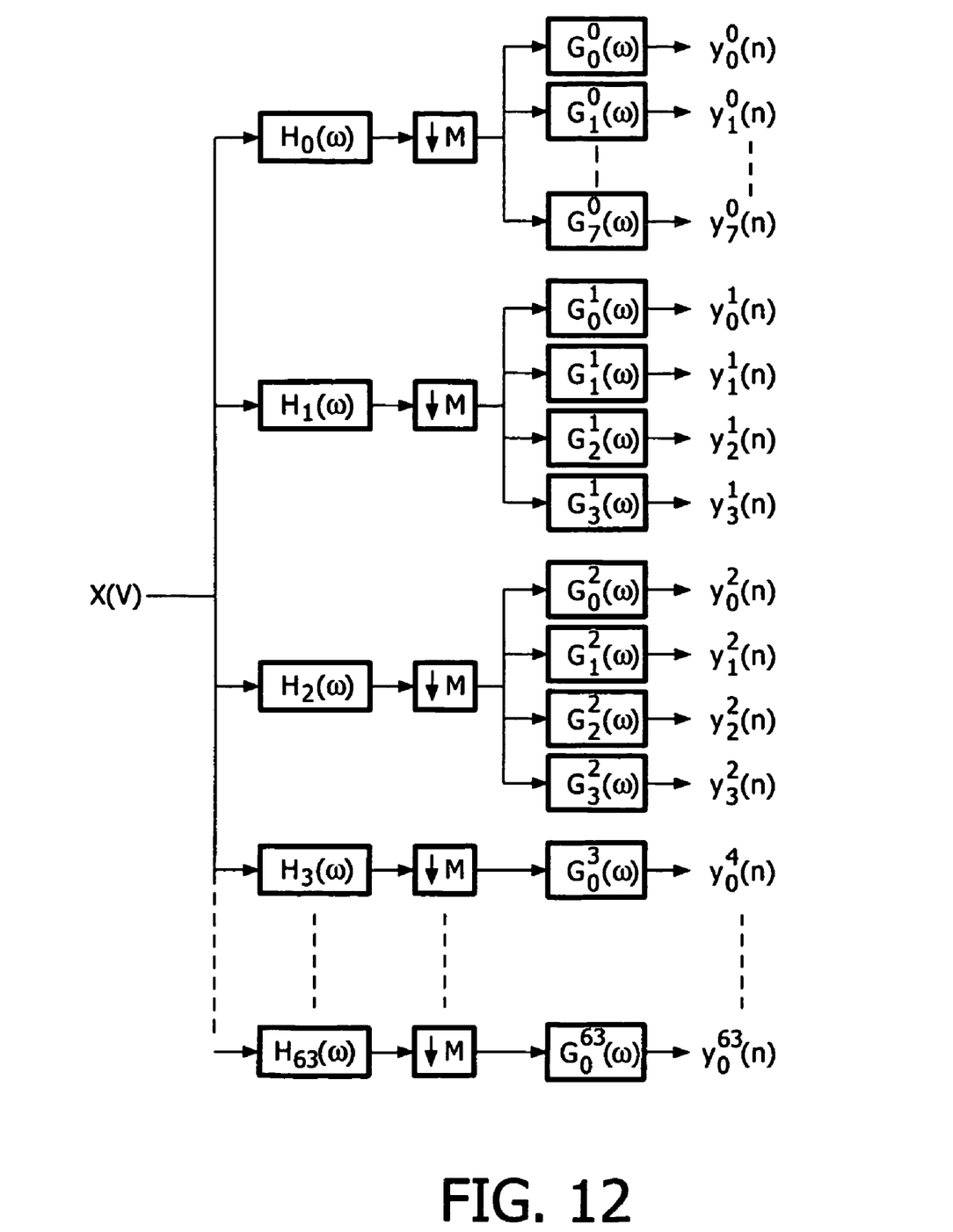
FIG. 12 shows a 77 bands non-uniform hybrid analysis filter bank based on 64 bands complex analysis QMF according to an embodiment of the invention.

From this point on the 77 complex-valued time-aligned left and right sub-subband signals are denoted as $l_q^k(n)$ and $r_q^k(n)$ respectively, accordingly the indexing of $y_q^k(n)$.

To estimate the stereo parameters at a certain sub-band sample position n' the left, right and non-normalized cross-channel excitation are calculated as:

$$e_l(b) = \sum_{q=q_l}^{q_h} \sum_{k=k_l}^{k_h} \sum_{n=0}^{L-1} h^2(n)\left(\left|l_q^k\left(n'-\frac{L}{2}+1+n\right)\right|^2 + \varepsilon\right) \quad (20)$$

$$e_r(b) = \sum_{q=q_l}^{q_h} \sum_{k=k_l}^{k_h} \sum_{n=0}^{L-1} h^2(n)\left(\left|r_q^k\left(n'-\frac{L}{2}+1+n\right)\right|^2 + \varepsilon\right)$$

$$e_R(b) = \sum_{q=q_l}^{q_h} \sum_{k=k_l}^{k_h} \sum_{n=0}^{L-1} h^2(n)\left(l_q^k\left(n'-\frac{L}{2}+1+n\right)r_q^{k*}\left(n'-\frac{L}{2}+1+n\right) + \varepsilon\right)$$

for every stereo bin b, h(n) is the sub-band domain window with length L, $\varepsilon$ a very small value preventing division by zero (e.g. $\varepsilon$=1e−10) and $l_q^k(n)$ and $r_q^k(n)$ the left and right sub-subband domain signals. In case of 20 stereo bins, the summation over k from $k_l$ up to and including $k_h$ and q from $q_l$ up to and including $q_h$ goes as shown in Table. Note that the 'negative' frequencies (e.g. k=0 with q=4 . . . 7) are not included in the parameter estimation of (20).

TABLE 1

Start and stop indices of summation over k and q

| b | $k_l$ | $k_h$ | $q_l$ | $q_h$ | Pass-band frequency region |
|---|---|---|---|---|---|
| 0 | 0 | 0 | 0 | 0 | 0-π/256 |
| 1 | 0 | 0 | 1 | 1 | π/256-2π/256 |
| 2 | 0 | 0 | 2 | 2 | 2π/256-3π/256 |
| 3 | 0 | 0 | 3 | 3 | 3π/256-π/64 |
| 4 | 1 | 1 | 2 | 2 | π/64-3π/128 |
| 5 | 1 | 1 | 3 | 3 | 3π/128-2π/64 |
| 6 | 2 | 2 | 0 | 0 | 2π/64-5π/128 |
| 7 | 2 | 2 | 1 | 1 | 5π/128-3π/64 |
| 8 | 3 | 3 | 0 | 0 | 3π/64-4π/64 |
| 9 | 4 | 4 | 0 | 0 | 4π/64-5π/64 |
| 10 | 5 | 5 | 0 | 0 | 5π/64-6π/64 |
| 11 | 6 | 6 | 0 | 0 | 6π/64-7π/64 |
| 12 | 7 | 7 | 0 | 0 | 7π/64-8π/64 |
| 13 | 8 | 8 | 0 | 0 | 8π/64-9π/64 |
| 14 | 9 | 10 | 0 | 0 | 9π/64-11π/64 |
| 15 | 11 | 13 | 0 | 0 | 11π/64-14π/64 |
| 16 | 14 | 17 | 0 | 0 | 14π/64-18π/64 |
| 17 | 18 | 22 | 0 | 0 | 18π/64-23π/64 |
| 18 | 23 | 34 | 0 | 0 | 23π/64-35π/64 |
| 19 | 35 | 63 | 0 | 0 | 35π/64-π |

The summations to calculate $e_l(b)$, $e_r(b)$ and $e_R(b)$ are aligned such that the mid-point of these signals in the summation coincides with the parameter position, hence the shift by $$-\frac{L}{2}+1.$$

As is clear from Table 1, only sub-subband signals and sub-band signals with a positive centre frequency are used for estimating stereo parameters.

The IID, denoted as I(b), the ICC, denoted as C(b) and the IPD, denoted as P(b) for each stereo bin b are calculated as:

$$I(b) = 10\log_{10}\left(\frac{e_l(b)}{e_r(b)}\right) \quad (21)$$

$$C(b) = \frac{|e_R(b)|}{\sqrt{e_l(b)e_r(b)}}$$

$$P(b) = \angle e_R(b)$$

The angle in the equation $P(b)=\angle e_R(b)$ is calculated using the four quadrant arctangent function giving values between −π and π. Depending on target bit rate and application, these parameters, or a subset of these parameters are quantized and coded into the PS part of the bit-stream.

Stereo Signal Synthesis

Figure 13:
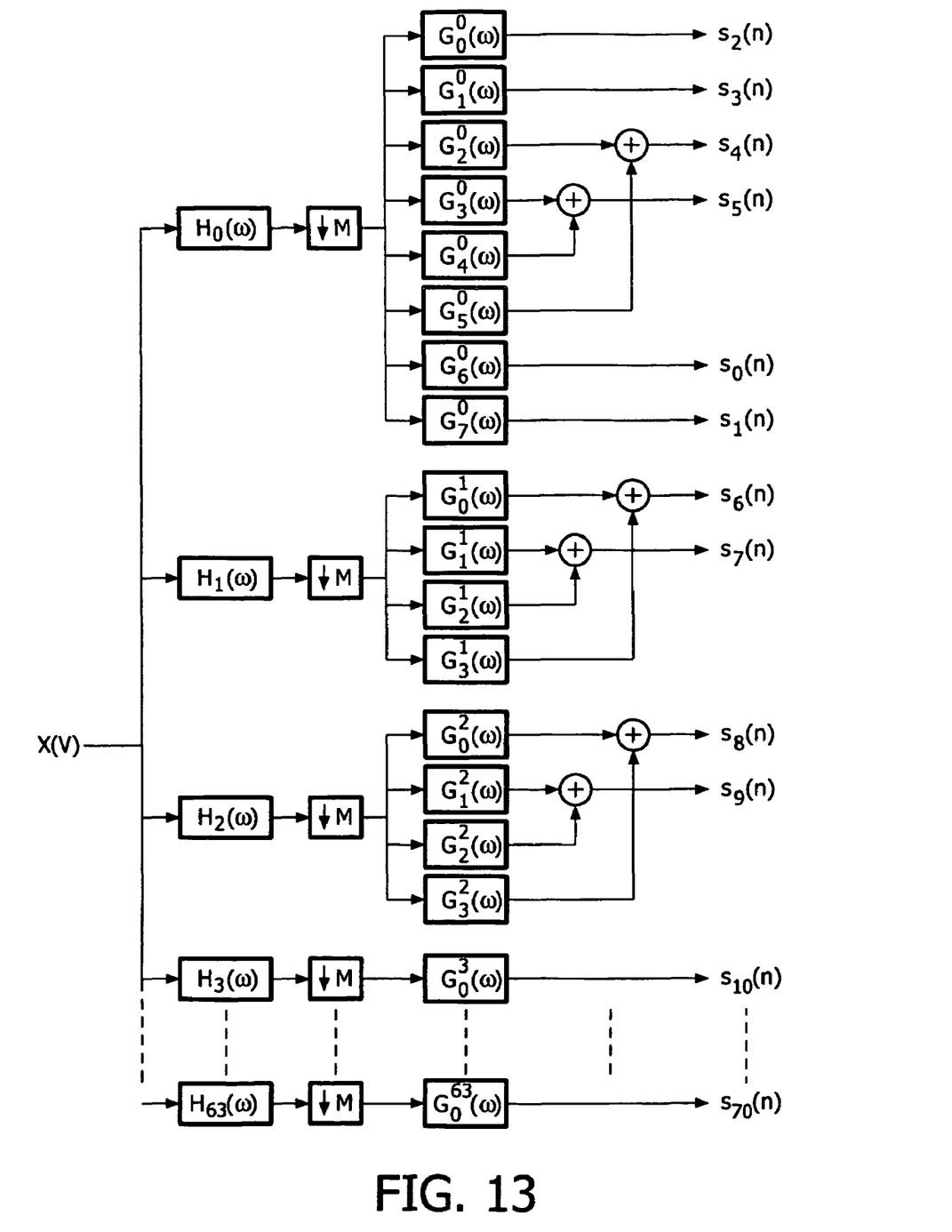
FIG. 13 shows a 71 bands non-uniform hybrid analysis filter bank based on 64 bands complex analysis QMF for use in an audio decoder.

In order to keep the computational costs (in terms of RAM usage) in the decoder as low as possible a similar analysis structure is used. However the first band is only partially complex (see FIG. 13). This is obtained by summation of the middle band pairs $G_2^0(\omega)$ and $G_5^0(\omega)$ and $G_3^0(\omega)$ and $G_4^0(\omega)$. Furthermore, the second and the third band are two-band real-valued filter banks, which is obtained by summation of the output of $G_0^k(\omega)$ and $G_3^k(\omega)$, and summation of the output of $G_1^k(\omega)$ and $G_2^k(\omega)$ (see also the discussion in the section about modulated filter banks). Using this simplification of the decoder filter-bank structure, still the discriminative feature between positive and negative frequencies is maintained by subdivision of the first sub-band filter. The decoder analysis filter bank is shown in FIG. 13. Notice that the indexing of the first QMF filtered (sub-)subband signals is sorted according to frequency.

The stereo (sub-)subband signals of a single frame are constructed as:

$$l_k(n)=\Lambda_{11}s_k(n)+\Lambda_{21}d_k(n)$$

$$r_k(n)=\Lambda_{12}s_k(n)+\Lambda_{22}d_k(n) \quad (22)$$

$$l_k(n)=l_k(n)e^{jP_n}$$

$$r_k(n)=r_k(n)e^{-jP_n} \quad (23)$$

with $s_k(n)$ the mono (sub-)subband signals, and $d_k(n)$ the mono de-correlated (sub-)subband signals that are derived from the mono (sub-)subband signals $s_k(n)$ in order to account for synthesizing the ICC parameters, k=0, . . . ,K−1 the sub-band index (K is the total number of sub-bands, i.e., K=71), QMF sub-band sample index n=0, . . . ,N−1 with N the number of sub-band samples of a frame, $\Lambda_{11}$, $\Lambda_{12}$, $\Lambda_{21}$, $\Lambda_{22}$ the scale factor manipulation matrices and $P_n$ the phase rotation manipulation matrix. The manipulation matrices are defined as function of time and frequency and can be derived straightforwardly from the manipulation vectors as described in the MPEG-4 standard ISO/IEC 14496-3:2001/FPDAM2, JTC1/SC29/WG11, Coding of Moving Pictures and Audio, Extension 2.

$s_k(n)$ is defined according to FIG. 12 as resulting in FIG. 13:

$$s_0(n)=y_6^0(n)$$

$$s_1(n)=y_7^0(n)$$

$$s_2(n)=y_0^0(n)$$

$$s_3(n)=y_1^0(n)$$

$$s_4(n)=y_2^0(n)+y_5^0(n)$$

$$s_5(n)=y_3^0(n)+y_4^0(n)$$

$$s_6(n)=y_0^1(n)+y_3^1(n)$$

$$s_7(n)=y_1^1(n)+y_2^1(n)$$

$$s_8(n)=y_0^2(n)+y_3^2(n)$$

$$s_9(n)=y_1^2(n)+y_2^2(n)$$

$$s_k(n)=y_0^{k-7}(n) \quad k=10\ldots70 \quad (24)$$

Synthesis of the stereo parameters takes place accordingly the indexing of Table 1.

TABLE 1

Parameter indexing table

| k | i(k) | Pass-band frequency region |
|---|---|---|
| 0 | 1* | −2π/256--π/256 |
| 1 | 0* | −π/256-0 |
| 2 | 0 | 0-π/256 |
| 3 | 1 | π/256-2π/256 |
| 4 | 2 | 2π/256-3π/256 |
| 5 | 3 | 3π/256-π/64 |
| 6 | 5 | 3π/128-2π/64 |
| 7 | 4 | 2π/128-3π/128 |
| 8 | 6 | 4π/128-5π/128 |
| 9 | 7 | 5π/128-6π/128 |
| 10 | 8 | 3π/64-4π/64 |

TABLE 1-continued

Parameter indexing table

| k | i(k) | Pass-band frequency region |
|---|------|---------------------------|
| 11 | 9 | 4π/64-5π/64 |
| 12 | 10 | 5π/64-6π/64 |
| 13 | 11 | 6π/64-7π/64 |
| 14 | 12 | 7π/64-8π/64 |
| 15 | 13 | 8π/64-9π/64 |
| 16-17 | 14 | 9π/64-11π/64 |
| 18-20 | 15 | 11π/64-14π/64 |
| 21-24 | 16 | 14π/64-18π/64 |
| 25-29 | 17 | 18π/64-23π/64 |
| 30-41 | 18 | 23π/64-35π/64 |
| 42-70 | 19 | 35π/64-π |

The synthesis equations thus look like:

$$l_k(n)=\Lambda_{11}(i(k),n)s_k(n)+\Lambda_{21}(i(k),n)d_k(n)$$

$$r_k(n)=\Lambda_{12}(i(k),n)s_k(n)+\Lambda_{22}(i(k),n)d_k(n) \quad (25)$$

$$l_k(n)=l_k(n)e^{jP(i(k),n)}$$

$$r_k(n)=r_k(n)e^{-jP(i(k),n)} \quad (26)$$

Note that the sign of P changes in the equations above if a * is encountered in the table. This is accordingly equation (19), i.e., the inverse phase rotation has to be applied for the negative frequencies.

Efficient Implementation of Modulated Filter Banks with Trivial Synthesis

Given a modulated filter bank with a prototype filter of length L, a direct form implementation would require QL operations per input sample, but the fact that the modulation in (6) is antiperiodic with period Q can be used to split the filtering into a polyphase windowing of L operations followed by a transform of size Q for each input sample. Please note that a polyphase representation as such is known from P. P. Vaidyanathan, "Multirate systems and filter banks", Prentice Hall Signal Processing Series, 1993, section 4.3). The following provides an advantageous application of such a polyphase representation according to a preferred embodiment of the invention.

The transform is a DFT followed by a phase twiddle, which is of the order of $Q \log_2 Q$, when Q is a power of two. So a large saving is obtained in typical cases where L is much larger than $\log_2 Q$. In the real modulated case (8), antiperiodicity of period 2Q combined with even/odd symmetries around n=0 and n=Q can again be used for polyphase windowing, and the transform kernel is a DCT of type III. A detailed description for the case of complex modulation is given below.

An effective implementation of the sub-subfiltering, using FFT core processing, may be realized using poly-phase decomposition of the prototype filter followed by modulation. Assume a prototype filter g(n) of order N, where N=mQ and m is a positive integer. This condition is not restrictive, since a prototype filter of arbitrary order can be zero padded to fulfill the constraint. The Z-transform of the prototype filter designed for use in a complex modulated system (6) is $$G(z) = \sum_{n=-N/2}^{N/2} g(n)z^{-n} \quad (27)$$

This may be expressed in poly-phase notation as $$G(z) = \sum_{l=0}^{Q-1} E_l(z^Q)z^{-l} \quad (28)$$

where $$E_l(z) = \sum_{n=-N/(2Q)}^{N/(2Q)} g(Qn+l)z^{-n} \quad (29)$$

All filters of the filterbank are frequency-modulated versions of the prototype filter. The Z-transform of the filter $g_q(n)$ is given by $$G_q(z) = G\left(zW^{q+\frac{1}{2}}\right) \quad (30)$$

where $$W = e^{-j\frac{2\pi}{Q}} \quad (31)$$

The expression for the output from one filter is $$Y_q(z) = G_q(z)V(z) = G\left(zW^{q+\frac{1}{2}}\right)V(z) \quad (32)$$

$$= \sum_{l=0}^{Q-1} E_l(-z^Q)V(z)z^{-l}W^{\frac{1}{2}l}W^{-ql}$$

$$= \sum_{l=0}^{Q-1} E_l(-z^Q)V(z)z^{-l}e^{j\frac{\pi}{Q}l}e^{j\frac{2\pi}{Q}ql}$$

Figure 14:
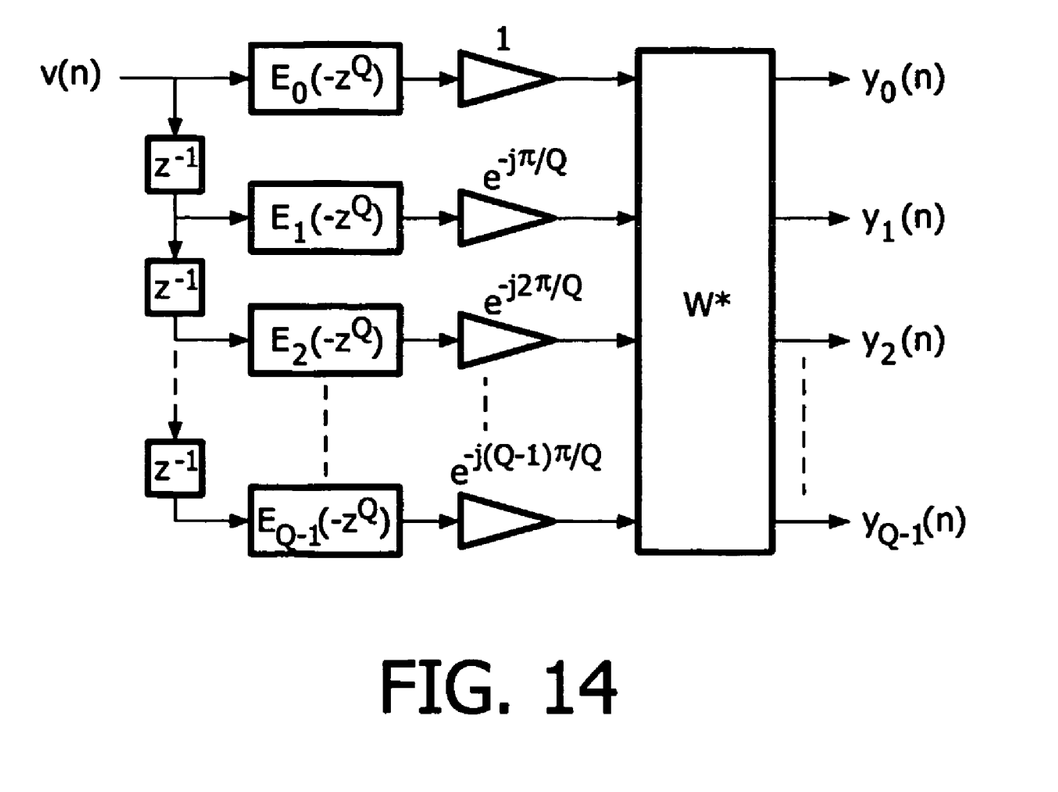
FIG. 14 shows a block diagram of efficient implementation of the complex modulated analysis filter bank The drawings only show those elements that are necessary to understand the invention.

By identifying the components of the last sum, it may be seen that the poly-phase components process delayed versions of the input signal, which subsequently are multiplied by a complex exponential. Finally, all the output signals $Y_q(z)$, q= 0 . . . Q−1, are found by applying an inverse FFT (without scaling factor). FIG. 14 shows the layout for the analysis filter bank. Since the poly-phase filters in (29) are non-causal, a proper amount of delay has to be added to all the poly-phase components.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word 'comprising' does not exclude the presence of other elements or steps than those listed in a claim. The invention can be implemented by means of hardware comprising several distinct elements, and by means of a suitably programmed computer. In a device claim enumerating several means, several of these means can be embodied by one and the same item of hardware. The mere fact that certain measures are recited in mutually different dependent claims does not indicate that a combination of these measures cannot be used to advantage.

The invention claimed is:

1. A method of encoding an audio signal, the audio signal comprising a first audio channel and a second audio channel, the method comprising:
  subband filtering each of the first audio channel and the second audio channel in a complex modulated filterbank to provide a first plurality of subband signals for the first audio channel and a second plurality of subband signals for the second audio channel;
  downsampling each of the subband signals to provide a first plurality of downsampled subband signals and a second plurality of downsampled subband signals;
  further subband filtering at least one of the downsampled subband signals in a further filterbank in order to provide a plurality of sub-subband signals, wherein a number of downsampled subband signals subjected to the further subband filtering is smaller than a total number of downsampled subband signals so that downsampled subband signals that are not further subband filtered remain;
  deriving spatial parameters from the sub-subband signals and from the downsampled subband signals that are not further subband filtered; and
  deriving a single channel audio signal comprising derived subband signals derived from the first plurality of downsampled subband signals and the second plurality of downsampled subband signals.

2. The method as claimed in claim 1, wherein for each subband that is further subband filtered, the sub-subband signals are added together after scaling and/or phase rotation to form a new subband signal, and wherein the single channel audio signal is derived from these new subband signals and the downsampled subband signals that are not further filtered.

3. The method as claimed in claim 1, wherein the further subband filtering is performed on at least the lowest frequency subband signal of the first plurality of downsampled subband signals and on the lowest frequency subband signal of the second plurality of downsampled subband signals.

4. The method as claimed in claim 3, wherein the further subband filtering is further performed on at least the next lowest frequency subband signal of the first plurality of downsampled subband signals and on the next lowest frequency subband signal of the second plurality of downsampled subband signals.

5. The method as claimed in claim 4, wherein the number of sub-subbands in the lowest frequency subband signals is higher than the number of sub-subbands in the next lowest frequency subband signals.

6. The method as claimed in claim 1, wherein the further subband filterbank is at least partially a complex modulated filter bank.

7. The method as claimed in claim 1, wherein the further subband filterbank is at least partially a real valued cosine modulated filter bank.

8. The method as claimed in claim 1, wherein the further subband filter bank is an oddly stacked filter bank.

9. The method as claimed in claim 1, wherein the sub-subband signals are not further downsampled.

10. The method as claimed in claim 1, wherein the single channel audio signal is bandwidth limited and further coded and wherein spectral band replication parameters are derived from the first plurality of downsampled subband signals and/or the second plurality of downsampled subband signals.

11. A computer program product comprising code for instructing a computer to perform the method as claimed in claim 1.

12. An audio encoder for encoding an audio signal, the audio signal comprising a first audio channel and a second audio channel, the encoder comprising:
  a first complex modulated filterbank for subband filtering the first audio channel to provide a first plurality of subband signals for the first audio channel;
  a second complex modulated filterbank for subband filtering the second audio channel to provide a second plurality of subband signals for the second audio channel;
  a downsampler for downsampling each of the subband signals to provide a first plurality of downsampled subband signals and a second plurality of downsampled subband signals;
  a further filterbank for further subband filtering at least one of the downsampled subband signals in order to provide a plurality of sub-subband signals, wherein a number of downsampled subband signals subjected to the further subband filtering is smaller than a total number of downsampled subband signals so that downsampled subband signals that are not further subband filtered remain;
  a parameter extractor for deriving spatial parameters from the sub-subband signals and from the downsampled subband signals that are not further subband filtered; and
  a downmixer for deriving a single channel audio signal comprising derived subband signals derived from the first plurality of downsampled subband signals and the second plurality of downsampled subband signals.

13. An apparatus for transmitting or storing an encoded audio signal based on an input audio signal, the apparatus comprising:
  an input unit to receive an input audio signal;
  an audio encoder as claimed in claim 12 for encoding the input audio signal to obtain an encoded audio signal; and
  a channel coder to further code the encoded audio signal into a format suitable for transmitting or storing.

14. A method of decoding an encoded audio signal, the encoded audio signal comprising an encoded single channel audio signal and a set of spatial parameters, the method of decoding comprising:
  decoding the encoded single channel audio channel to obtain a plurality of downsampled subband signals;
  further subband filtering at least one of the downsampled subband signals in a further filterbank in order to provide a plurality of sub-subband signals, wherein a number of downsampled subband signals sublected to the further subband filtering is smaller than a total number of downsampled subband signals so that downsampled subband signals that are not further subband filtered remain; and
  deriving two audio channels from the spatial parameters, the sub-subband signals and the downsampled subband signals that are not further subband filtered.

15. The method as claimed in claim 14, wherein the further subband filtering is performed on at least the lowest frequency subband signal of the plurality of downsampled subband signals.

16. The method as claimed in claim 15, wherein the further subband filtering is further performed on at least the next lowest frequency subband signal of the plurality of downsampled subband signals.

17. The method as claimed in claim 16, wherein the number of sub-subbands in the lowest frequency subband signals is higher than the number of sub-subbands in the next lowest frequency subband signals.

18. The method as claimed in claim 14, wherein the further subband filter bank is at least partially a complex modulated filter bank.

19. The method as claimed in claim 14, wherein the further subband filterbank is at least partially a real valued cosine modulated filter bank.

20. The method as claimed in claim 14, wherein the further subband filter bank is an oddly stacked filter bank.

21. The method as claimed in claim 14, wherein, in the lowest frequency subband, phase modifications to the sub-subband signals having a negative center-frequency in time domain are determined by taking the negative of the phase modification applied on a sub-subband signal having a positive centerfrequency which is in absolute value closest to said negative center-frequency.

22. The method as claimed in claim 14, wherein the encoded audio signal comprises spectral band replication parameters and wherein a high frequency component is derived from the plurality of downsampled subband signals and the spectral band replication parameters and wherein the two audio channels are derived from the spatial parameters, the sub-subband signals, the downsampled subband signals that are not further subband filtered and the high frequency component.

23. A computer program product comprising code for instructing a computer to perform the method as claimed in claim 14.

24. An audio decoder for decoding an encoded audio signal, the encoded audio signal comprising an encoded single channel audio signal and a set of spatial parameters, the audio decoder comprising:
a decoder for decoding the encoded single channel audio channel to obtain a plurality of downsampled subband signals;
a further filter bank for further subband filtering at least one of the downsampled subband signals in a further filterbank in order to provide a plurality of sub-subband signals, wherein a number of downsampled subband signals subjected to the further subband filtering is smaller than a total number of downsampled subband signals so that downsampled subband signals that are not further subband filtered remain; and
a downmixer for deriving two audio channels from the spatial parameters, the sub-subband signals and the downsampled subband signals that are not further subband filtered.

25. An apparatus for reproducing an output audio signal, the apparatus comprising:
an input unit for obtaining an encoded audio signal;
an audio decoder as claimed in claim 24 for decoding the encoded audio signal to obtain the output audio signal; and
a reproduction unit, such as a speaker or headphone output, for reproducing the output audio signal.

26. A method of encoding an audio signal, the audio signal comprising a first audio channel and a second audio channel, the method comprising:
subband filtering each of the first audio channel and the second audio channel in a complex modulated filterbank to provide a first plurality of subband signals for the first audio channel and a second plurality of subband signals for the second audio channel;
downsampling each of the subband signals to provide a first plurality of downsainpled subband signals and a second plurality of downsampled subband signals;
further subband filtering at least one of the downsampled subband signals in a further filterbank in order to provide a plurality of sub-subband signals;
deriving spatial parameters from the sub-subband signals and from the downsampled subband signals that are not further subband filtered; and
deriving a single channel audio signal comprising derived subband signals derived from the first plurality of downsampled subband signals and the second plurality of downsampled subband signals,
wherein for each subband that is further subband filtered, the sub-subband signals are added together after scaling and/or phase rotation to form a new subband signal,
and wherein the single channel audio signal is derived from these new subband signals and the downsa.mpled subband signals that are not further filtered.

27. A method of decoding an encoded audio signal, the encoded audio signal comprising an encoded single channel audio signal and a set of spatial parameters, the method of decoding comprising:
decoding the encoded single channel audio channel to obtain a plurality of downsampled subband signals;
further subband filtering at least one of the downsampled subband signals in a further filterbank in order to provide a plurality of sub-subband signals; and
deriving two audio channels from the spatial parameters, the sub-subband signals and the downsampled subband signals that are not further subband filtered,
wherein, in the lowest frequency subband, phase modifications to the sub-subband signals having a negative center-frequency in time domain are determined by taking the negative of the phase modification applied on a sub-subband signal having a positive center-frequency which is in absolute value closest to said negative center-frequency.

28. A method of decoding an encoded audio signal, the encoded audio signal comprising an encoded single channel audio signal and a set of spatial parameters, the method of decoding comprising:
decoding the encoded single channel audio channel to obtain a plurality of downsaxnpled subband signals;
further subband filtering at least one of the downsampled subband signals in a further filterbank in order to provide a plurality of sub-subband signals, wherein a number of downsampled subband signals subjected to the further subband filtering is smaller than a total number of downsampled subband signals so that downsampled subband signals that are not further subband filtered remain; and
deriving two audio channels from the spatial parameters, the sub-subband signals and the downsampled subband signals that are not further subband filtered,
wherein the encoded audio signal comprises spectral band replication parameters,
wherein a high frequency component is derived from the plurality of downsampled subband signals and the spectral band replication parameters,
and wherein the two audio channels are derived from the spatial parameters, the sub-subband signals, the downsampled subband signals that are not further subband filtered and the high frequency component.

* * * * *